(12) United States Patent
Manickam et al.

(10) Patent No.: US 10,816,616 B2
(45) Date of Patent: Oct. 27, 2020

(54) PHASE SHIFTED MAGNETOMETRY ADAPTIVE CANCELLATION

(71) Applicant: LOCKHEED MARTIN CORPORATION, Bethesda, MD (US)

(72) Inventors: Arul Manickam, Bethesda, MD (US); Peter G. Kaup, Bethesda, MD (US); Gregory Scott Bruce, Bethesda, MD (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 189 days.

(21) Appl. No.: 16/031,096

(22) Filed: Jul. 10, 2018

(65) Prior Publication Data
US 2019/0018086 A1    Jan. 17, 2019

Related U.S. Application Data

(60) Provisional application No. 62/531,340, filed on Jul. 11, 2017.

(51) Int. Cl.
*G01R 33/26* (2006.01)
(52) U.S. Cl.
CPC .................................. *G01R 33/26* (2013.01)
(58) Field of Classification Search
CPC  G01R 33/26; G01R 33/032; G01R 33/34061; G01R 33/3678; G01R 33/445; G01R 33/307; G01R 33/3607; G01R 33/323; G01R 33/46; G01R 29/24; G01N 24/12; G01N 24/006; G01N 24/087; B82Y 10/00
USPC .................................................. 324/300–305
See application file for complete search history.

(56) References Cited

U.S. PATENT DOCUMENTS 10,545,200 B2 * 1/2020 Barry .................... G01R 33/12
2015/0001422 A1 * 1/2015 Englund ............ G01N 21/6458
250/459.1

* cited by examiner

*Primary Examiner* — Melissa J Koval
*Assistant Examiner* — Rahul Maini
(74) *Attorney, Agent, or Firm* — Foley & Lardner LLP

(57) ABSTRACT

A system for magnetic detection of an external magnetic field is described. The system includes a controller configured to control components of the system. The controller is configured to control an optical excitation source and a RF excitation source to apply pulse sequences to a magneto-optical defect center material such that in the excitation pulses of a first pair of RF excitation pulses have a first phase difference, the excitation pulses of a second pair of RF excitation pulses have a second phase difference, and the second phase difference is different from the first phase difference. The controller computes a combined magnetometry curve as a function of the RF excitation frequency based on a difference between a measured value of a first light detection signal and a measured value of a second light detection signal. The controller sets the first phase difference and the second phase difference based on the combined magnetometry curve.

29 Claims, 9 Drawing Sheets

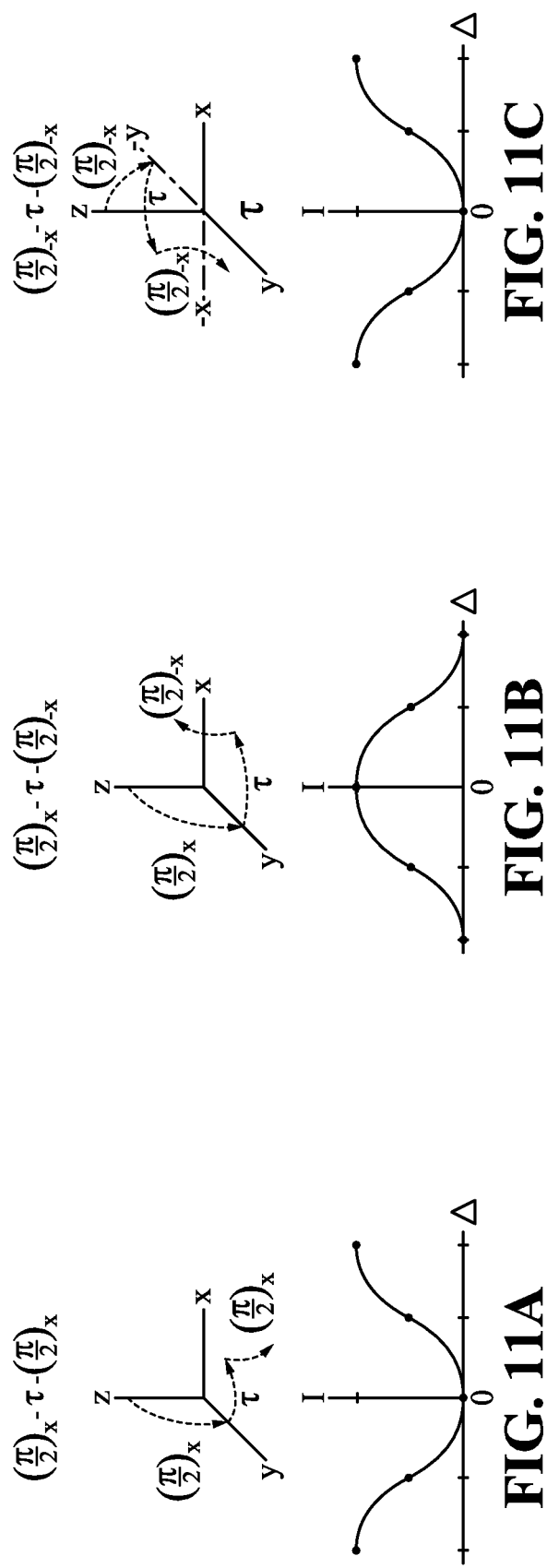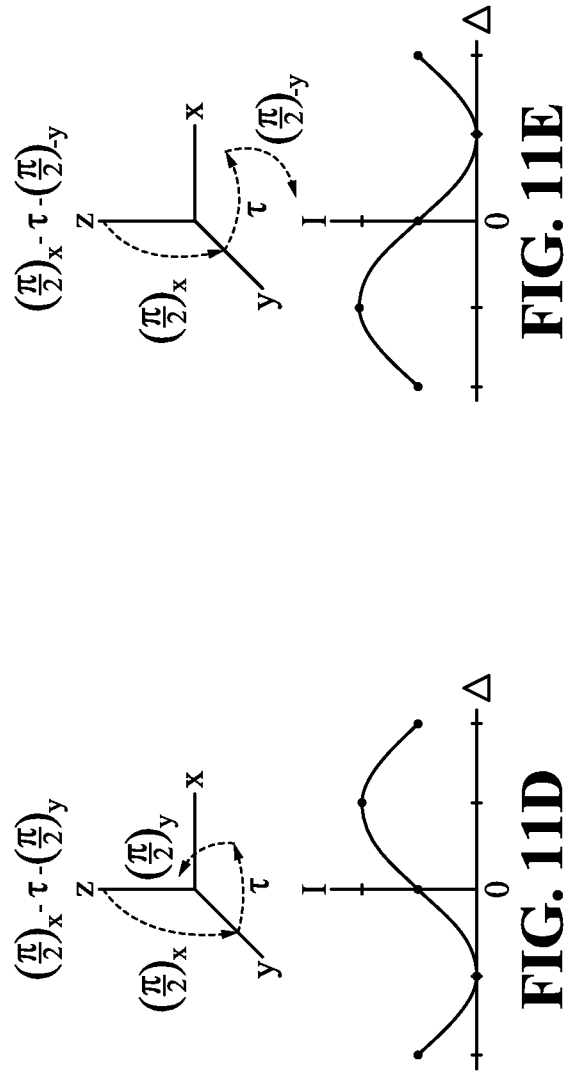
FIG. 11A FIG. 11B FIG. 11C FIG. 11D FIG. 11E

PHASE SHIFTED MAGNETOMETRY ADAPTIVE CANCELLATION

CROSS-REFERENCE TO RELATED PATENT APPLICATION

The present application claims the benefit of priority from U.S. Provisional Patent Application No. 62/531,340, filed Jul. 11, 2017, which is incorporated herein by reference in its entirety.

FIELD

The present disclosure generally relates to magnetic detection systems, and more particularly, to measurement collection schemes for a magnetic detection system.

BACKGROUND

Many advanced magnetic detection (such as imaging) systems can operate in limited conditions, for example, high vacuum and/or cryogenic temperatures, which can make them inapplicable for applications that require ambient conditions. Small size, weight and power (SWAP) magnetic sensors of moderate sensitivity, vector accuracy, and bandwidth are likewise deficient for certain detection (such as imaging) applications.

SUMMARY

According to some embodiments, there is provided a system for magnetic detection of an external magnetic field. The system comprises: a magneto-optical defect center material comprising a plurality of magneto-optical defect centers; a radio frequency (RF) excitation source configured to provide RF excitations to the magneto-optical defect center material; an optical excitation source configured to provide optical excitation to the magneto-optical defect center material; an optical detector configured to receive an optical signal based on light emitted by the magneto-optical defect center material; and a controller configured to: control the optical excitation source and the RF excitation source to apply a first pulse sequence to the magneto-optical defect center material, the first pulse sequence comprising a first optical excitation pulse, a first pair of RF excitation pulses separated by a first time period, and a second optical excitation pulse to the magneto-optical defect center material; control the optical excitation source and the RF excitation source to apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference; receive a first light detection signal from the optical detector based on an optical signal emitted by the magneto-optical defect center material due to the second optical excitation pulse; receive a second light detection signal from the optical detector based on an optical signal emitted by the magneto-optical defect center material due to the fourth optical excitation pulse; and compute a combined magnetometry curve as a function of the RF excitation frequency based on a difference between a measured value of the first light detection signal and a measured value of the second light detection signal; and set the first phase difference and the second phase difference based on the combined magnetometry curve.

According to some embodiments, the controller may be further configured to compute an external magnetic field acting on the magneto-optical defect center material based on the combined magnetometry curve.

According to some embodiments, the RF excitation source comprises a microwave antenna.

According to some embodiments, the controller may be configured to apply the first pair of RF excitation pulses followed by the second pair of RF excitation pulses.

According to some embodiments, optical signals emitted by the magneto-optical defect center material due to the second and fourth optical excitation pulses are fluorescence signals.

According to some embodiments, the difference between the first phase difference and the second phase difference is about 180°.

According to some embodiments, the first phase difference is about 0° and the second phase difference is about 180°.

According to some embodiments, the first phase difference is about −90° and the second phase difference is about 90°.

According to some embodiments, the controller may be further configured to set the first phase difference and the second phase difference so as to track a linear region of the combined magnetometry curve.

According to some embodiments, the controller may be further configured to set the first phase difference and the second phase difference so as to track a region of maximum slope of the combined magnetometry curve within the linear region.

According to some embodiments, the controller may be further configured to set the first phase difference and the second phase difference so as to track a region of maximum slope of the combined magnetometry curve.

According to some embodiments, the controller comprises a plurality of subcontrollers.

According to some embodiments, the magneto-optical defect center material may be a nitrogen vacancy (NV) diamond material comprising a plurality of NV centers.

According to some embodiments, the first time period and the second time period are the same.

According to some embodiments, a method for magnetic detection using a magneto-optical defect center material comprising a plurality of defect centers may be provided. The method comprises: applying a first pulse sequence to the magneto-optical defect center material, the first pulse sequence comprising a first optical excitation pulse, a first pair of RF excitation pulses separated by a first time period, and a second optical excitation pulse to the magneto-optical defect center material; applying a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference may be different from the first phase difference; receiving a first light detection signal from an optical detector based on an optical signal emitted by the magneto-optical defect center material due to the second optical excitation pulse; receiving a second light detection signal from the optical detector based on an optical signal emitted by the magneto-optical defect center material due to the fourth optical excitation pulse; computing a combined magnetometry curve as a function of the RF excitation frequency based on a difference between a measured value of the first light detection signal and a measured value of the second light detection signal; and setting the first phase difference and the second phase difference based on the combined magnetometry curve.

According to some embodiments, the method further comprises computing an external magnetic field acting on the magneto-optical defect center material based on the combined measurement.

According to some embodiments, the first pair of RF excitation pulses may be applied followed by the second pair of RF excitation pulses.

According to some embodiments, optical signals emitted by the magneto-optical defect center material due to the second and fourth optical excitation pulses are fluorescence signals.

According to some embodiments, the difference between the first phase difference and the second phase difference is about 180°.

According to some embodiments, the first phase difference is about 0° and the second phase difference is about 180°.

According to some embodiments, the first phase difference is about −90° and the second phase difference is about 90°.

According to some embodiments, the method further comprises setting the first phase difference and the second phase difference so as to track a linear region of the combined magnetometry curve.

According to some embodiments, the method further comprises setting the first phase difference and the second phase difference so as to track a region of maximum slope of the combined magnetometry curve.

According to some embodiments, the method further comprises setting the first phase difference and the second phase difference so as to track a region of maximum slope of the combined magnetometry curve.

According to some embodiments, the magneto-optical defect center material may be a nitrogen vacancy (NV) diamond comprising a plurality of NV centers.

According to some embodiments, the first time period and the second time period are the same.

According to some embodiments, a system for magnetic detection using a magneto-optical defect center material comprising a plurality of defect centers is provided. The system comprises: means for applying a first pulse sequence to the magneto-optical defect center material, the first pulse sequence comprising a first optical excitation pulse, a first pair of RF excitation pulses separated by a first time period, and a second optical excitation pulse to the magneto-optical defect center material; means for applying a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference; means for receiving a first light detection signal from an optical detector based on an optical signal emitted by the magneto-optical defect center material due to the second optical excitation pulse; means for receiving a second light detection signal from the optical detector based on an optical signal emitted by the magneto-optical defect center material due to the fourth optical excitation pulse; and means for computing a combined measurement based on a difference between a measured value of the first light detection signal and a measured value of the second light detection signal.

According to some embodiments, a system for magnetic detection of an external magnetic field is provided. The systems comprises: a magneto-optical defect center material comprising a plurality of magneto-optical defect centers; a radio frequency (RF) excitation source configured to provide RF excitations to the magneto-optical defect center material; an optical excitation source configured to provide optical excitation to the magneto-optical defect center material; an optical detector configured to receive an optical signal based on light emitted by the magneto-optical defect center material; and a controller configured to: control the optical excitation source and the RF excitation source to apply a first pulse sequence to the magneto-optical defect center material, the first pulse sequence comprising a first optical excitation pulse, a first pair of RF excitation pulses separated by a first time period, and a second optical excitation pulse to the magneto-optical defect center material; control the optical excitation source and the RF excitation source to apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference; receive a first light detection signal from the optical detector based on an optical signal emitted by the magneto-optical defect center material due to the second optical excitation pulse; receive a second light detection signal from the optical detector based on an optical signal emitted by the magneto-optical defect center material due to the fourth optical excitation pulse; and compute a combined magnetometry curve as a function of the RF excitation frequency based on a difference between a measured value of the first light detection signal and a measured value of the second light detection signal.

According to some embodiments, there is provided a system for magnetic detection of an external magnetic field. The system comprises: a magneto-optical defect center material comprising a plurality of magneto-optical defect centers; a radio frequency (RF) excitation source configured to provide RF excitations to the magneto-optical defect center material; an optical excitation source configured to provide optical excitation to the magneto-optical defect center material; an optical detector configured to receive an optical signal based on light emitted by the magneto-optical defect center material; and a controller configured to: control the optical excitation source and the RF excitation source to apply a first pulse sequence to the magneto-optical defect center material, the first pulse sequence comprising a first continuous wave optical excitation and a first pair of RF excitation pulses separated by a first time period, the first continuous wave optical excitation occurring continuously from before, during and after the first pair of RF excitation pulses; control the optical excitation source and the RF excitation source to apply a second pulse sequence to the magneto-optical defect center material, the second pulse sequence comprising a second continuous wave optical excitation and a second pair of RF excitation pulses separated by a second time period, the second continuous wave optical excitation occurring continuously from before, during and after the second pair of RF excitation pulses, wherein the excitation pulses of the first pair of RF excitation pulses have a first phase difference, the excitation pulses of the second pair of RF excitation pulses have a second phase difference, and the second phase difference is different from the first phase difference; receive a first light detection signal from the optical detector based on an optical signal emitted by the magneto-optical defect center material due to the first continuous wave optical excitation; receive a second light detection signal from the optical detector based on an optical signal emitted by the magneto-optical defect center material due to the second continuous wave optical excitation; and compute a combined magnetometry curve as a function of the RF excitation frequency based on a difference between a measured value of the first light detection signal and a measured value of the second light detection signal; and set the first phase difference and the second phase difference based on the combined magnetometry curve.

According to some embodiments, a method for magnetic detection using a magneto-optical defect center material comprising a plurality of defect centers may be provided. The method comprises: applying a first pulse sequence to the magneto-optical defect center material, the first pulse sequence comprising a first continuous wave optical excitation and a first pair of RF excitation pulses separated by a first time period, the first continuous wave optical excitation occurring continuously from before, during and after the first pair of RF excitation pulses; applying a second pulse sequence to the magneto-optical defect center material, the second pulse sequence comprising a second continuous wave optical excitation and a second pair of RF excitation pulses separated by a second time period, the second continuous wave optical excitation occurring continuously from before, during and after the second pair of RF excitation pulses, wherein the excitation pulses of the first pair of RF excitation pulses have a first phase difference, the excitation pulses of the second pair of RF excitation pulses have a second phase difference, and the second phase difference is different from the first phase difference; receiving a first light detection signal from an optical detector based on an optical signal emitted by the magneto-optical defect center material due to the first continuous wave optical excitation; receiving a second light detection signal from the optical detector based on an optical signal emitted by the magneto-optical defect center material due to the second continuous wave optical excitation; computing a combined magnetometry curve as a function of the RF excitation frequency based on a difference between a measured value of the first light detection signal and a measured value of the second light detection signal; and setting the first phase difference and the second phase difference based on the combined magnetometry curve.

BRIEF DESCRIPTION OF THE DRAWINGS

FIG. 11A illustrates a Bloch sphere, and fluorescence curve, for a first RF excitation pulse having a 0° phase and a second RF excitation pulse having a 0° phase as in some embodiments.
FIG. 11B illustrates a Bloch sphere, and fluorescence curve, for a first RF excitation pulse having a 0° phase and a second RF excitation pulse having a 180° phase as in some embodiments.
FIG. 11C illustrates a Bloch sphere, and fluorescence curve, for a first RF excitation pulse having a 180° phase and a second RF excitation pulse having a 180° phase as in some embodiments.
FIG. 11D illustrates a Bloch sphere, and fluorescence curve, for a first RF excitation pulse having a 0° phase and a second RF excitation pulse having a 90° phase as in some embodiments.
FIG. 11E illustrates a Bloch sphere, and fluorescence curve, for a first RF excitation pulse having a 0° phase and a second RF excitation pulse having a −90° phase as in some embodiments.

DETAILED DESCRIPTION

The present disclosure generally relates to magnetic detection systems, and to measurement collection schemes for a magnetic detection system using phase shifted magnetometry adaptive cancellation technique. The system uses a Ramsey pulse sequence to detect and measure the magnetic field acting on the system. The Ramsey pulse sequence includes a first pair of RF excitation pulses having a first phase difference between pulses, and a second pair of RF excitation pulses having a second phase difference between pulses. The second phase difference may be different from the first phase difference, and may be about 180°, for example. Each of the first pair of RF excitation pulses and the second pair of RF excitation pulses has a magnetometry curve corresponding thereto.

A combined magnetometry curve may be obtained by taking the difference between the magnetometry curve corresponding to the first pair of RF excitation pulses and the magnetometry curve corresponding to the second pair of RF excitation pulses. The combined magnetometry curve, which may be the difference in magnetometry curves, reduces vertical noise, i.e., noise in the vertical direction in the magnetometry curve, such as due to laser intensity fluctuations. Thus, the phase shifted magnetometry adaptive cancellation technique provides a reduction in vertical noise.

Further, the phase shifted magnetometry adaptive cancellation technique using a combined magnetometry curve may be implemented to allow for tracking a linear and/or maximum slope of the combined curve. This may be accomplished, for example, by a controller setting the first phase difference between pulses of the first pair and setting the second phase difference between pulses of the second pair so as to track the region of interest in the combined magnetometry curve. Thus, the dynamic ranges of the magnetic field detection may be increased by the controller adjusting the phases of the first and second RF excitation pairs.

The NV Center, its Electronic Structure, and Optical and RF Interaction

Figure 1:
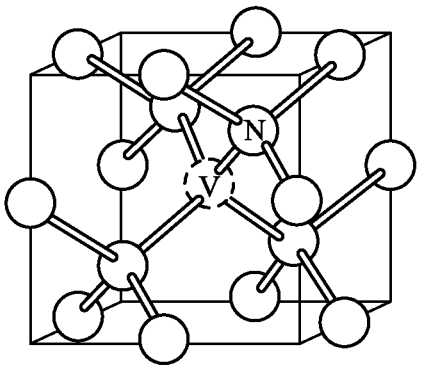
FIG. 1 illustrates one orientation of a nitrogen vacancy (NV) center in a diamond lattice.

The NV center in a diamond comprises a substitutional nitrogen atom in a lattice site adjacent a carbon vacancy as shown in FIG. 1. The NV center may have four orientations, each corresponding to a different crystallographic axis of the diamond lattice.

The NV center may exist in a neutral charge state or a negative charge state. The neutral charge state uses the nomenclature $NV^0$, while the negative charge state uses the nomenclature NV.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
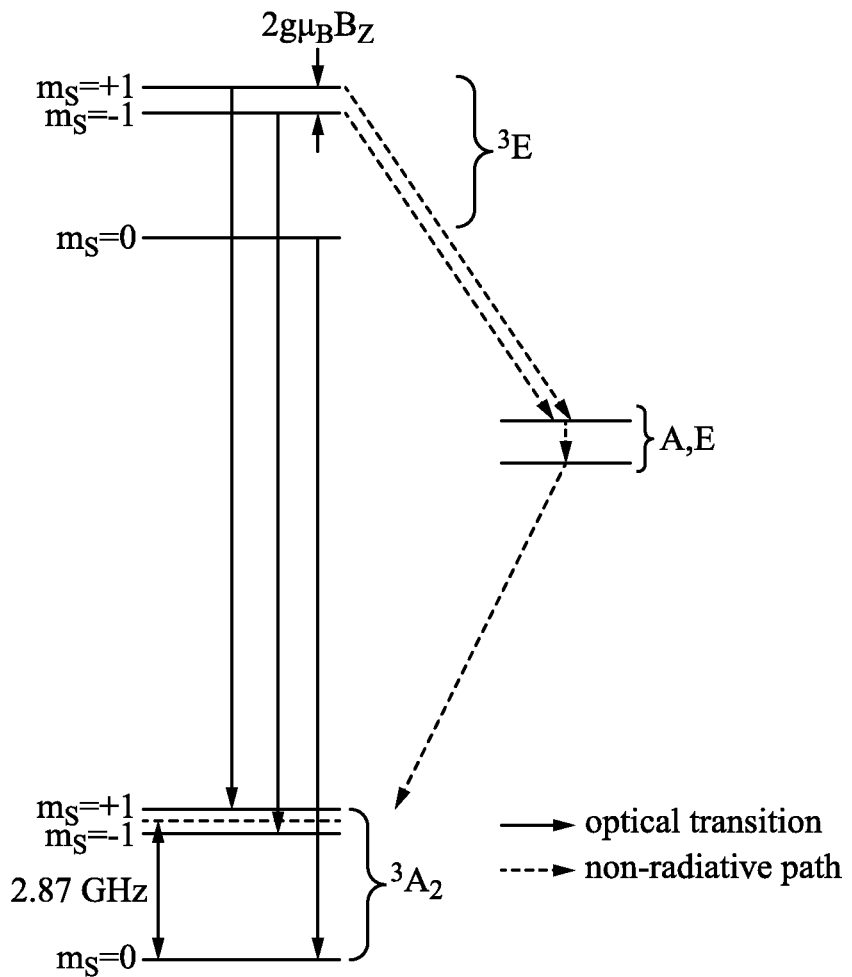
FIG. 2 is an energy level diagram showing energy levels of spin states for an NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm1$ energy levels by an energy of 2.87 GHz for a zero external magnetic field.

Introducing an external magnetic field with a component along the NV axis lifts the degeneracy of the $m_s=\pm1$ energy levels, splitting the energy levels $m_s=\pm1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is a straightforward matter and will not materially affect the computational and logic steps.

The NV center electronic structure further includes an excited triplet state $^3E$ with corresponding $m_s=0$ and $m_s=\pm1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

An alternative non-radiative decay route from the triplet $^3E$ to the ground state $^3A_2$ via intermediate electron states exists, in which the intermediate states are thought to be intermediate singlet states A, E with intermediate energy levels. The transition rate from the $m_s=\pm1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm1$ spins states. These features of the decay from the excited triplet $^3E$ state via the intermediate singlet states A, E to the ground state triplet $^3A_z$ allows that, if optical excitation is provided to the system, the optical excitation will eventually pump the NV center into the $m_s=0$ spin state of the ground state $^3A_2$. In this way, the population of the $m_s=0$ spin state of the ground state $^3A_2$ may be reset to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm1$ states than for the $m_s=0$ spin state. This is so because the decay via the intermediate states does not result in a photon emitted in the fluorescence band, and because of the greater probability that the $m_s=\pm1$ states of the excited triplet $^3E$ state will decay via the non-radiative decay path. The lower fluorescence intensity for the $m_s=\pm1$ states than for the $m_s=0$ spin state allows the fluorescence intensity to be used to determine the spin state. As the population of the $m_s=\pm1$ states increases relative to the $m_s=0$ spin, the overall fluorescence intensity will be reduced.

The NV Center, or Magneto-Optical Defect Center, Magnetic Sensor System

Figure 3:
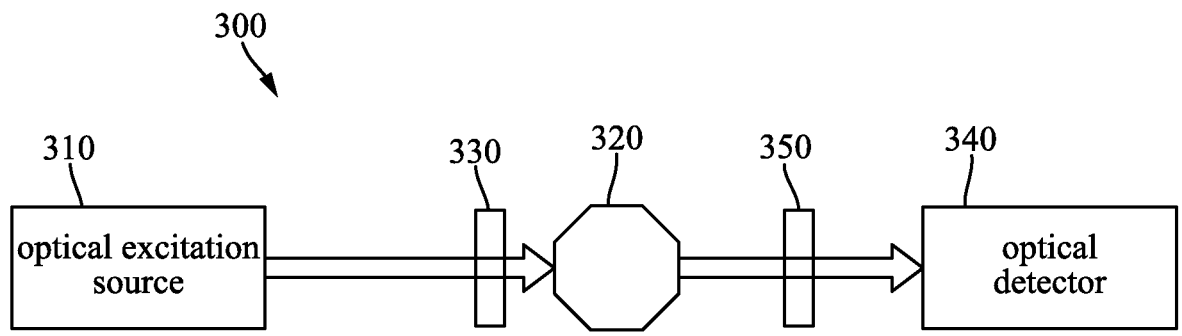
FIG. 3 is a schematic diagram illustrating an NV center magnetic sensor system.

FIG. 3 is a schematic diagram illustrating an NV center magnetic sensor system 300 that uses fluorescence intensity to distinguish the $m_s=\pm1$ states, and to measure the magnetic field based on the energy difference between the $m_s=+1$ state and the $m_s=-1$ state. The system 300 includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, and there is a decrease in the fluorescence intensity.

The optical excitation source 310 may be a laser or a light emitting diode, for example, which emits light in the green, for example. The optical excitation source 310 induces fluorescence in the red, which corresponds to an electron transition from the excited state to the ground state. Light from the NV diamond material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
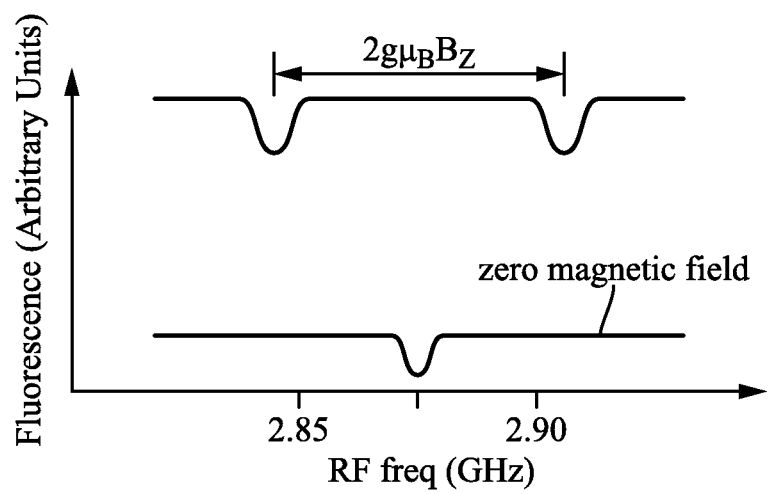
FIG. 4 is a graph illustrating the fluorescence as a function of an applied RF frequency of an NV center along a given direction for a zero magnetic field and for a magnetic field of amplitude $B_z$.

For continuous wave excitation, the optical excitation source 310 continuously pumps the NV centers, and the RF excitation source 330 sweeps across a frequency range that includes the zero splitting (when the $m_s=\pm1$ spin states have the same energy) photon energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence and spin echo pulse sequence.

Figure 5A:
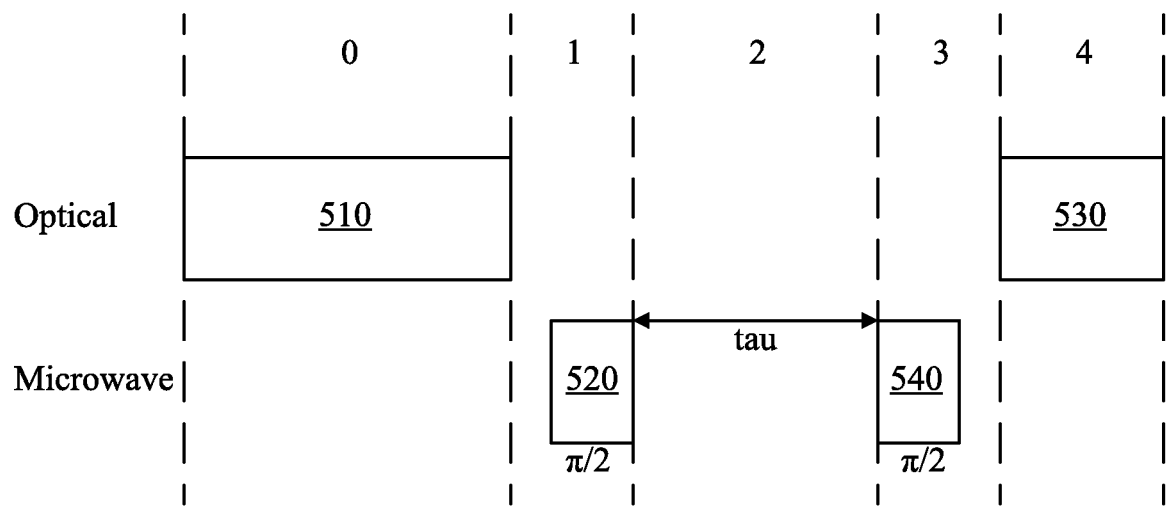
FIG. 5A is a schematic illustrating a Ramsey sequence of optical excitation pulses and RF excitation pulses.

The Ramsey pulse sequence is a pulsed RF-pulsed laser scheme that measures the free precession of the magnetic moment in the diamond material 320 with NV centers, and is a technique that quantum mechanically prepares and samples the electron spin state. FIG. 5A is a schematic diagram illustrating the Ramsey pulse sequence. As shown in FIG. 5A, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s=0$ spin state). This is followed by a first RF excitation pulse 520 (in the form of, for example, a microwave (MW) π/2 pulse) during a period 1. The first RF excitation pulse 520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and dephase) over a time period referred to as tau (π). During this free precession time period, the system measures the local magnetic field and serves as a coherent integration. Next, a second RF excitation pulse 540 (in the form of, for example, a MW π/2 pulse) is applied during a period 3 to project the system back to the $m_s=0$ and $m_s=+1$ basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

Figure 5B:
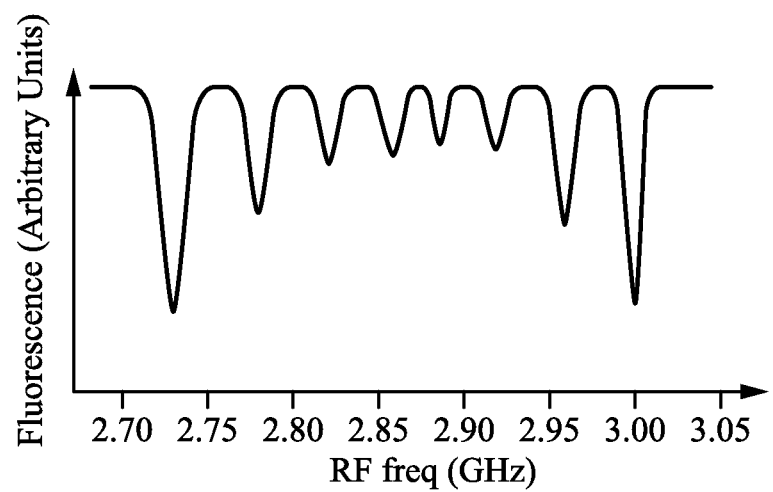
FIG. 5B is a graph illustrating the fluorescence as a function of an applied RF frequency for four different NV center orientations for a non-zero magnetic field.

In general, the diamond material 320 will have NV centers aligned along directions of four different orientation classes, and thus along the four different crystallographic axes of diamond. FIG. 5B illustrates a response curve, specifically fluorescence, as a function of RF frequency for the case where the diamond material 320 has NV centers aligned along directions of four different orientation classes. In this case, the component Bz along each of the different orientations may be determined. FIG. 5B illustrates a spectra with eight electron spin resonances, with two electron spin resonances for each diamond crystallographic axis, the two electron spin resonances corresponding to the $m_s=-1$ spin state and the $m_s=+1$ spin state. The electron spin resonances are positioned on the FIG. 5B spectra at spectral positions along the RF frequency axis of FIG. 5. In FIG. 5B the eight electron spin resonances are separated to be at different spectral positions along the RF frequency axis.

While FIG. 3 illustrates an NV center magnetic sensor system 300 with NV diamond material 320 with a plurality of NV centers, in general, the magnetic sensor system may instead employ a different magneto-optical defect center material, with a plurality of magneto-optical defect centers. The electron spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material. The magneto-optical defect centers may be spin centers in silicon carbide, for example, where the substrate may be formed of silicon carbide, or the defect centers may be atomic substitutions in silicon, such as phosphorous in silicon, for example. In general, the electron spin centers may be in magneto-optical defect center material.

Figure 6:
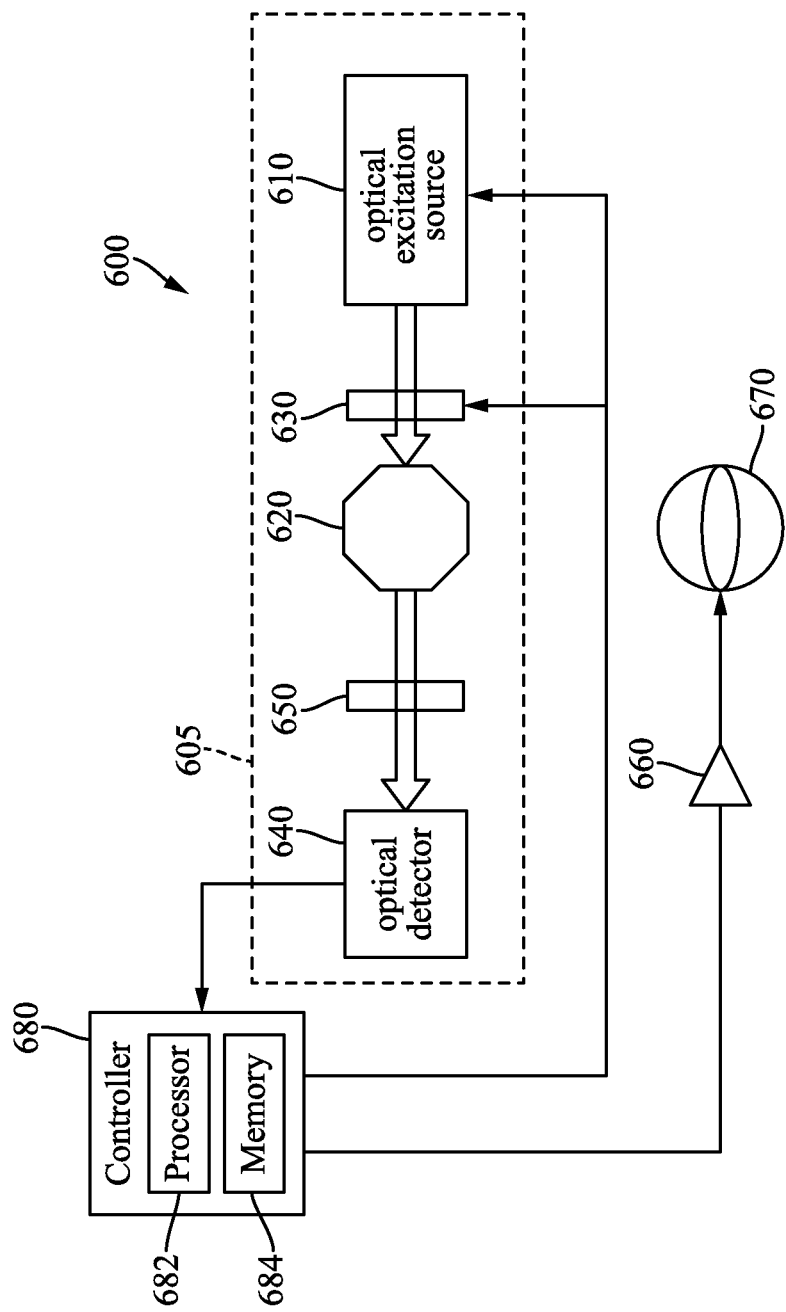
FIG. 6 is a schematic diagram illustrating some embodiments of a magnetic field detection system.

FIG. 6 is a schematic diagram of a system 600 for a magnetic field detection system according to some embodiments. The system 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620. A magnetic field generator 670 generates a magnetic field, which is detected at the NV diamond material 620.

The magnetic field generator 670 may generate magnetic fields with orthogonal polarizations, for example. In this regard, the magnetic field generator 670 may include two or more magnetic field generators, such as two or more Helmholtz coils or other magnetic electronic devices. The two or more magnetic field generators may be configured to provide a magnetic field having a predetermined direction, each of which provide a relatively uniform magnetic field at the NV diamond material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600 may be arranged to include one or more optical detection systems 605, where each of the optical detection systems 605 includes the optical detector 640, optical excitation source 610, and NV diamond material 620. Furthermore, the magnetic field generator 670 may have a relatively high power as compared to the optical detection systems 605. In this way, the optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The system 600 further includes a controller 680 arranged to receive a light detection signal from the optical detector 640 and to control the optical excitation source 610, the RF excitation source 630, and the second magnetic field generator 675, and to perform calculations. The controller may be a single controller, or may have multiple subcontrollers. For a controller including multiple subcontrollers, each of the subcontrollers may perform different functions, such as controlling different components of the system 600. The second magnetic field generator 675 may be controlled by the controller 680 via an amplifier 660, for example.

The RF excitation source 630 may be a microwave coil, for example. The RF excitation source 630 is controlled to emit RF radiation with a photon energy resonant with the transition energy between the ground $m_s=0$ spin state and the $m_s=±1$ spin states as discussed above with respect to FIG. 3.

The optical excitation source 610 may be a laser or a light emitting diode, for example, which emits light in the green, for example. The optical excitation source 610 induces fluorescence in the red from the NV diamond material 620, where the fluorescence corresponds to an electron transition from the excited state to the ground state. Light from the NV diamond material 620 may be directed through the optical filter 650 to filter out light in the excitation band (in the green, for example), and to pass light in the red fluorescence band, which in turn may be detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 may be arranged to receive a light detection signal from the optical detector 640 and to control the optical excitation source 610, the RF excitation source 630, and the second magnetic field generator 675. The controller may include a processor 682 and a memory 684, in order to control the operation of the optical excitation source 610, the RF excitation source 630, and the second magnetic field generator 675, and to perform calculations. The memory 684, which may include a nontransitory computer readable medium, may store instructions to allow the operation of the optical excitation source 610, the RF excitation source 630, and the second magnetic field generator 675 to be controlled. That is, the controller 680 may be programmed to provide control.

Measurement Collection Process

According to certain embodiments, the controller 680 controls the operation of the optical excitation source 610, the RF excitation source 630, and the magnetic field generator 670 to perform Optically Detected Magnetic Resonance (ODMR). Specifically, the magnetic field generator 670 may be used to apply a bias magnetic field that sufficiently separates the intensity responses corresponding to electron spin resonances for each of the four NV center orientations. The controller 680 then controls the optical excitation source 610 to provide optical excitation to the NV diamond material 620 and the RF excitation source 630 to provide RF excitation to the NV diamond material 620. The resulting fluorescence intensity responses for each of the NV axes are collected over time to determine the components of the external magnetic field Bz aligned along directions of the four NV center orientations which respectively correspond to the four diamond lattice crystallographic axes of the NV diamond material 620, which may then be used to calculate the estimated vector magnetic field acting on the system 600. The excitation scheme utilized during the measurement collection process (i.e., the applied optical excitation and the applied RF excitation) may be any appropriate excitation scheme. For example, the excitation scheme may utilize continuous wave (CW) magnetometry, pulsed magnetometry, and variations on CW and pulsed magnetometry (e.g., pulsed RF excitation with CW optical excitation). In cases where Ramsey pulse RF sequences are used, pulse parameters 7C and τ may be optimized using Rabi analysis and FID-Tau sweeps prior to the collection process, as described in, for example, U.S. patent application Ser. No. 15/003,590 entitled "APPARATUS AND METHOD FOR HIGH SENSITIVITY MAGNETOMETRY MEASUREMENT AND SIGNAL PROCESSING IN A MAGNETIC DETECTOR SYSTEM" filed Jan. 21, 2016, incorporated by referenced in its entirety. The pulse parameters π and τ may also be optimized using another optimization scheme.

During the measurement collection process, fluctuations may occur in the measured intensity response due to effects caused by components of the system 600, rather than due to true changes in the external magnetic field. For example, prolonged optical excitation of the NV diamond material by the optical excitation source 610 may cause vertical (e.g., red photoluminescence intensity) fluctuations, or vertical drift, in the intensity response, causing the response curve to shift upward or downward over time.

Phase-Shifts Between Ramsey Pulse Sequence

Figure 7:
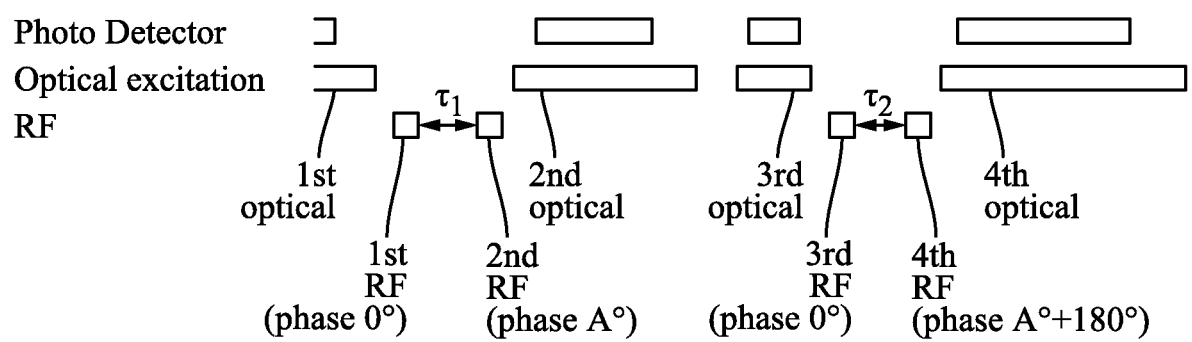
FIG. 7 is schematic illustrating a Ramsey pulse sequence according to some embodiments.

Ramsey pulse sequence is a pulsed RF scheme that is believed to measure the free precession of the magnetic moment of spin states in a magnetic field. FIG. 7 is a schematic illustrating Ramsey pulse sequences according so some embodiments using pairs of phase shifted RF pulses, where the pairs have a different relative phase shift. FIG. 7 illustrates the timing for optical excitation by an optical excitation source, such as a laser, photodetection of fluorescence intensity from the light emitted by the magneto-optical defect center material, and RF pulses. FIG. 7 illustrates two pulse sequences, for example. More than two pulse sequences may also be used.

As shown in FIG. 7, an exemplary Ramsey pulse sequence includes optical excitation pulses (e.g., from a laser) and RF excitation pulses over a first pulse sequence and then over a second pulse sequence. A first optical excitation pulse may be applied to the system to optically pump electrons into the ground state (i.e., ms=0 spin state). This may be followed by a first RF excitation pulse having a pulse width. The first RF excitation pulse may set the system into a superposition of the ms=0 and ms=+1 spin states (or, alternatively, the ms=0 and ms=−1 spin states, depending on the choice of resonance location). Following the first RF excitation pulse, the spins are allowed to freely precess (and dephase) over a time period $\tau_1$. During this free precession time period, the system precesses in the local magnetic field at a rate proportional to the magnetic field and serves as a coherent integration. Next, a second RF excitation pulse may be applied to project the system back to the ms=0 and ms=+1 basis (or, alternatively, the ms=0 and ms=−1 spin states, depending on the choice of resonance location). The pulse width of the first and second RF excitation pulses may be the same, for example. Finally, a second optical pulse may be applied to optically sample the system and a measurement basis may be obtained by detecting the fluorescence intensity from the magneto-optical defect center material.

The first and second RF excitation pulses may have a phase difference with respect to each other. The phase for each of the first and second RF excitation pulses may be set by the controller 680. The controller may include a digital phase shifter for controlling the phase of the excitation pulses.

Continuing with FIG. 7, a second pair of RF excitation pulses may be provided which has a different phase shift between the RF excitation pulses than for the first pair of RF excitation pulses. In FIG. 7, a second Ramsey pulse sequence includes a third optical excitation pulse applied to the system to optically pump electrons into the ground state (i.e., ms=0 spin state). This may be followed by a third RF excitation pulse having a pulse width. The third RF excitation pulse may again set the system into superposition of the ms=0 and ms=+1 spin states (or, alternatively, the ms=0 and ms=−1 spin states, depending on the choice of resonance location). The spins are allowed to freely precess (and dephase) over a time period $\tau_2$. During this free precession time period, the system precesses in the local magnetic field at a rate proportional to the magnetic field and serves as a coherent integration. Next, a fourth RF excitation pulse may be applied to project the system back to the ms=0 and ms=+1 basis. The pulse width of the third and fourth RF excitation pulses may be the same, for example. Finally, a fourth optical pulse may be applied to optically sample the system and a measurement basis may be obtained by detecting the fluorescence intensity of the system.

As shown in FIG. 7, the first and second RF excitation pulses, for example, have a phase of 0° and A°, respectively. Thus, the first and second RF excitation pulses have a first phase difference of A°. Further, the third and fourth RF excitation pulses, for example, have a phase of 0° and (A+180)°, respectively. Thus, the third and fourth RF excitation pulses have a phase difference of (A+180)°. In this case, the second phase difference may be different from the first phase difference, and the difference between the second phase difference and the first phase difference may exemplarily be about 180°. Alternatively, the difference between the second phase difference and the first phase difference may be other than about 180°.

Figure 8:
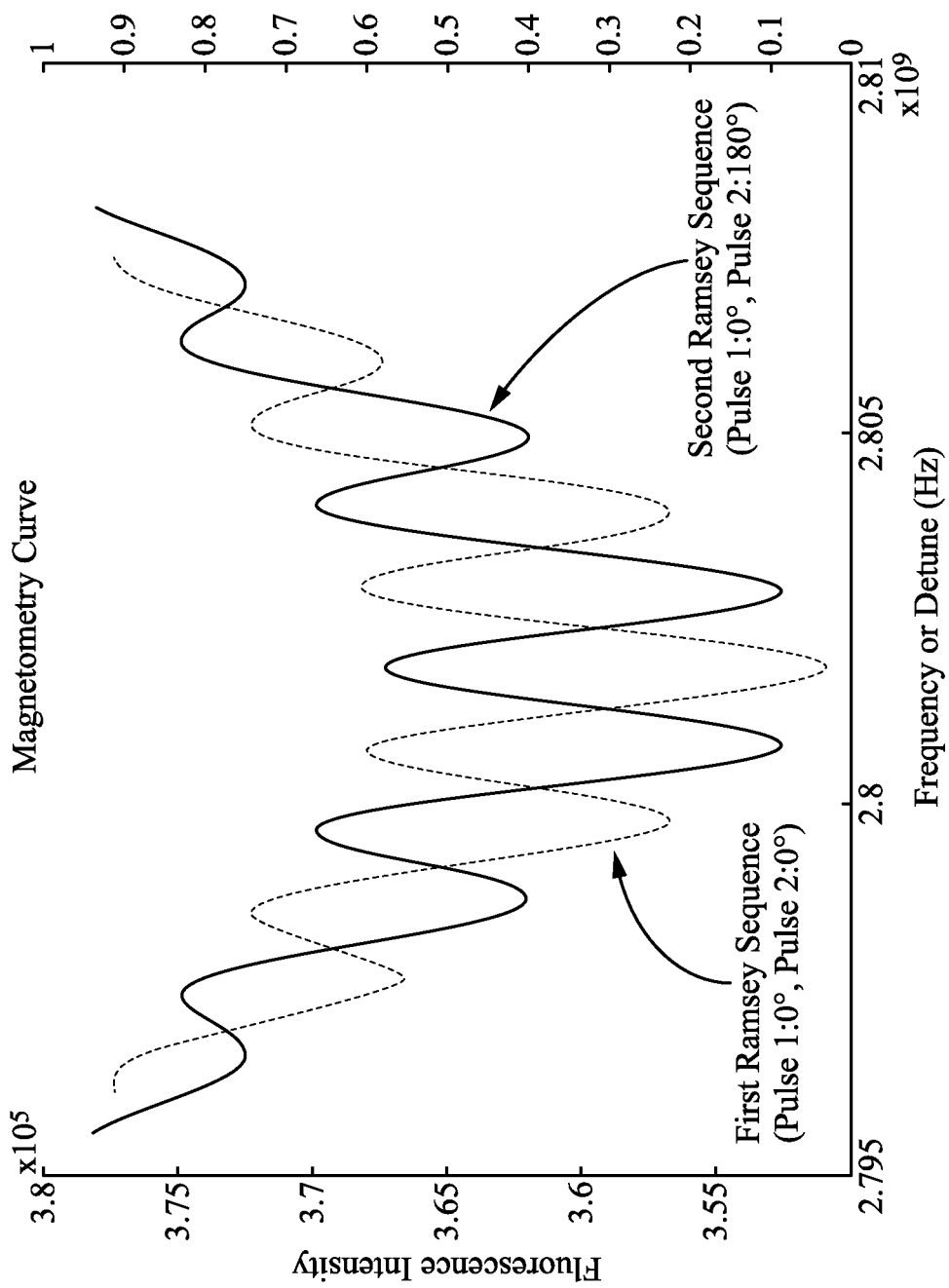
FIG. 8 illustrates two magnetometry curves according to some embodiments.

FIG. 8 depicts a plot of a magnetometry curve using Ramsey sequences in accordance with some embodiments, and in particular in accordance with the sequence of FIG. 7. The y-axis of the plot may be the measured fluorescence intensity from the magneto-optical defect material which may be detected, and the x-axis of the plot may be the frequency of the RF excitation pulses. The magnetometry curve may be due to the constructive/destructive interference of the three sinusoids that correspond to the hyperfine splitting in addition to side lobes caused by the Ramsey pulse.

FIG. 8 illustrates two magnetometry curves. One of the magnetometry curves may be for a Ramsey sequence in the case where first and second RF excitation pulses have a phase of 0° and 0° (A=0), respectively. Another of the magnetometry curves may be for a Ramsey sequence in the case where the third and fourth RF excitation pulses have a phase of 0° and 180° (A=0), respectively. Thus, the first and second RF excitation pulses have a first phase difference of 0° and the third and fourth RF excitation pulses have a second phase difference of 180°. In this case, the difference between the second phase difference and the first phase difference is 180°.

Figure 9:
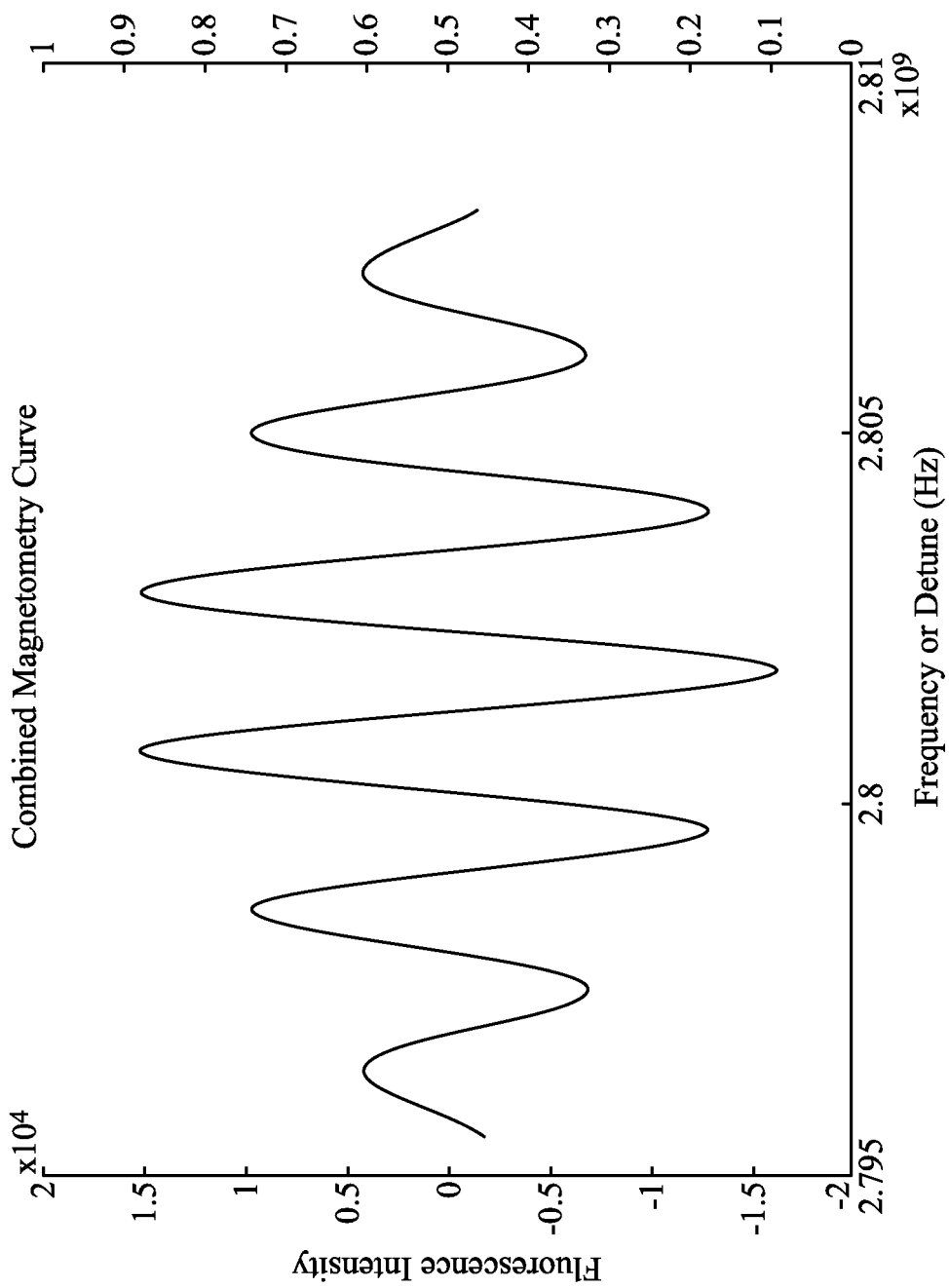
FIG. 9 illustrates a resulting magnetometry curve derived from the difference of two traditional magnetometry curves according to some embodiments.

FIG. 9 illustrates a combined magnetometry curve, where the two magnetometry curves shown in FIG. 8 are combined. The curves are combined by combining the intensities at each frequency value, such as for example, by taking the difference between intensities at each frequency value. FIG. 9 illustrates a combined magnetometry curve corresponding to a difference between the magnetometry curve where third and fourth RF excitation pulses have a phase difference of 180° and the magnetometry curve where the first and second RF excitation pulses have a phase difference of 0°.

Figure 10:
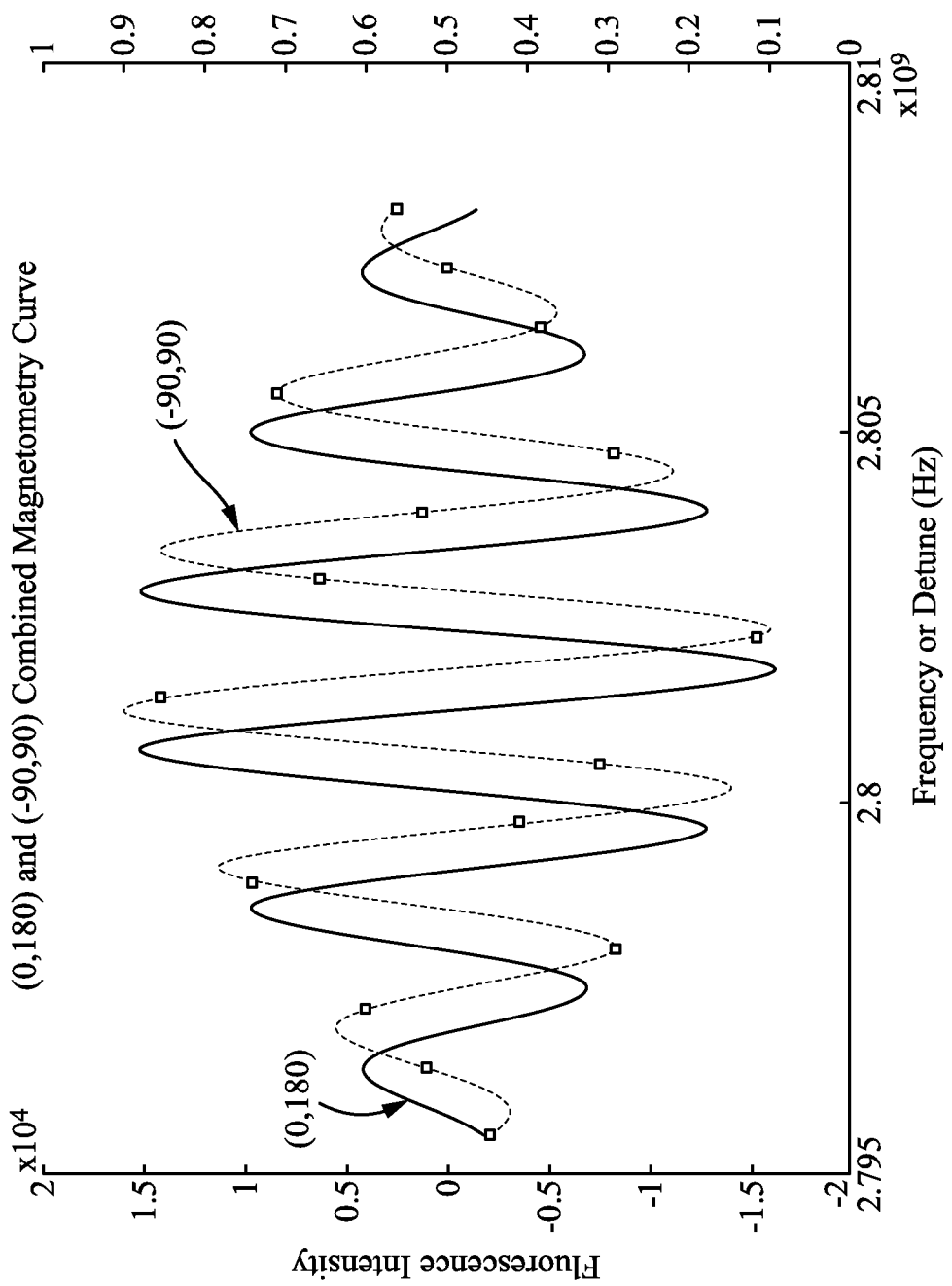
FIG. 10 illustrates two different resulting magnetometry curves according to some embodiments.

FIG. 10 illustrates two combined magnetometry curves. The curves are combined by combining the intensities at each frequency value, such as for example, by taking the difference between intensities at each frequency value. One of the combined magnetometry curves is the combined magnetometry curve from FIG. 9 where the phase difference in the first pair of RF excitation pulses is 0° and the phase difference in the second pair of RF excitation pulses is 180°. This combined magnetometry curve is thus designated as (0, 180), where the first number in parenthesis is the phase difference between the first and second excitation pulses, and the second number in parenthesis is the phase difference between the third and fourth excitation pulses. The other of the combined magnetometry curves in FIG. 10 is for the case where the phase difference in the first pair of RF excitation pulses is −90° and the phase difference in the second pair of RF excitation pulses is 90°. This combined magnetometry curve is thus designated as (−90, 90).

The effect of the Ramsey pulse sequence on the electronic spin states may be expressed in Bloch sphere representation. In Bloch sphere representation, the zero spin state and the minus one spin state (or, alternatively, the ms=0 and ms=+1 spin states, depending on the choice of resonance location) are represented as a vector extending from the origin to the surface of sphere at the North Pole and the South Pole, respectively. Other points on the sphere are a superposition of zero spin and minus one spin states. In the first pulse sequence, the first RF excitation pulse may move the state from the baseline zero spin state (at the North Pole) to the equator of the Bloch sphere for a π/2 RF excitation pulse, i.e., the π/2 RF excitation pulse rotates the vector by π/2 (90°) to the equator. The magnetic field during the precession time $\tau_1$ after the first RF pulse may move the vector around the equator of the Bloch sphere representation. The second RF excitation pulse, which is a π/2 RF excitation pulse, rotates the vector about an axis which depends on the phase difference between the first and second RF excitation pulses. The projection of the vector along the South Pole provides the component of spin state in the minus one spin state. The amount of dimming of the fluorescence will be proportional to the component of the spin state in the minus one spin state. In both combined magnetometry curves shown in FIG. 10, the difference between the phase difference of the second pair of RF excitation pulses and the phase difference of the first pair of RF excitation pulses is 180°.

FIGS. 11A-11E illustrate a Bloch sphere, and fluorescence, as a function of the detuning Δ from the resonant frequency for Ramsey sequences with various phases for the first and second RF excitation pulses, with a precession time $\tau_1$ between the first and second pulses. The RF excitation pulses are π/2 RF excitation pulses. FIG. 11A illustrates the case where the first RF excitation pulse has a zero phase and has a field along the x direction. The second RF excitation pulse also has a zero phase and has a field along the x direction. In this case, the first RF excitation pulse rotates the vector about the +x axis by π/2, the magnetic field then causes a precession in the x-y plane, and the second RF excitation pulse then rotates the vector about the +x axis by π/2. In this case the maximum fluorescence dimming, or minimum fluorescence, occurs for a detuning Δ of zero, i.e., at the resonant frequency.

FIG. 11B illustrates the case where the first RF excitation pulse has a zero phase and has a field along the +x direction. The second RF excitation pulse has a phase of 180°, and thus has a field along the −x direction. In this case, the first RF excitation pulse rotates the vector about the +x axis by π/2, the magnetic field then causes a precession in the x-y plane, and the second RF excitation pulse then rotates the vector about the −x axis by π/2. In this case the minimum fluorescence dimming, or maximum fluorescence, occurs for a detuning Δ of zero, i.e., at the resonant frequency.

FIG. 11C illustrates the case where the first RF excitation pulse has a 180° phase and has a field along the −x direction. The second RF excitation pulse also has a 180° phase and has a field along the −x direction. In this case, the first RF excitation pulse rotates the vector about the −x axis by π/2, the magnetic field then causes a precession in the x-y plane, and the second RF excitation pulse then rotates the vector about the −x axis by π/2. In this case the maximum fluorescence dimming, or minimum fluorescence, occurs for a detuning Δ of zero, i.e., at the resonant frequency in a similar fashion to FIG. 11A.

FIG. 11D illustrates the case where the first RF excitation pulse has a 0° phase and has a field along the +x direction. The second RF excitation pulse has a 90° phase and has a field along the +y direction. In this case, the first RF excitation pulse rotates the vector about the +x axis by $\pi/2$, the magnetic field then causes a precession in the x-y plane, and the second RF excitation pulse then rotates the vector about the +y axis by $\pi/2$. In this case the fluorescence dimming at a detuning $\Delta$ of zero, i.e., at the resonant frequency, is between the maximum and minimum dimming as seen in FIG. 11D.

FIG. 11E illustrates the case where the first RF excitation pulse has a 0° phase and has a field along the +x direction. The second RF excitation pulse has a -90° phase and has a field along the -y direction. In this case, the first RF excitation pulse rotates the vector about the +x axis by $\pi/2$, the magnetic field then causes a precession in the x-y plane, and the second RF excitation pulse then rotates the vector about the -y axis by $\pi/2$. In this case the fluorescence dimming at a detuning $\Delta$ of zero, i.e., at the resonant frequency, is between the maximum and minimum dimming as seen in FIG. 11E.

Referring back to FIG. 10 with the two combined magnetometry curves, the controller may set the first phase difference of the first RF excitation pair, and the second phase difference of the second RF excitation pair so as to track a region of the combined magnetometry curve to enhance accuracy of detection. For example, the first phase difference and the second phase difference may be set such that a linear region of the combined magnetometry curve is tracked. As another example, the first phase difference and the second phase difference may be set such that so that a region of maximum slope of the combined magnetometry curve is tracked. Still further, the first phase difference and the second phase difference may be set such that a region of maximum slope within a linear region of the combined magnetometry curve is tracked.

FIG. 10 illustrates a linear region L1, for example, of the (0, 180) combined magnetometry curve, and a linear region L2, for example, of the (-90, 90) combined magnetometry curve. As the magnetic field changes at the magneto-optical defect center material, the combined magnetometry curves will shift in RF frequency, i.e., to the left or right in FIG. 10. Because the controller may set the first phase difference of the first RF excitation pair, and the second phase difference of the second RF excitation pair, a region of maximum slope and/or a linear region may be continued to be tracked as the magnetic field changes. For example, the phases of the first and second RF excitation pairs may be switched between the (0, 180) combined magnetometry curve and the (-90, 90) combined magnetometry curve so as to remain in a region of maximum slope and/or a linear region as the magnetic field changes. Thus, the dynamic ranges of the magnetic field detection may be increased by adjusting the phases of the first and second RF excitation pairs.

FIG. 7 illustrates a Ramsey pulses sequence with optical excitation pulses both before and after a pair of RF excitation pulses. Alternatively, the optical excitation for the Ramsey pulse sequence may be in the form of a continuous wave optical excitation which is continuous before, during and after each pair of RF excitation pulses. Such a continuous wave technique for the optical excitation (read out) in a Ramsey pulse sequence is described, for example, in U.S. patent application Ser. No. 15/380,419 entitled "SELECTED VOLUME CONTINUOUS ILLUMINATION MAGNETOMETER" filed Dec. 15, 2016, incorporated by referenced in its entirety.

Embodiments have been described in detail with particular reference to preferred embodiments, but it will be understood by those skilled in the art that variations and modifications can be effected within the spirit and scope of this disclosure.

What is claimed is:

1. A system for magnetic detection of an external magnetic field, comprising:
   a magneto-optical defect center material comprising a plurality of magneto-optical defect centers;
   a radio frequency (RF) excitation source configured to provide RF excitations to the magneto-optical defect center material;
   an optical excitation source configured to provide optical excitation to the magneto-optical defect center material;
   an optical detector configured to receive an optical signal based on light emitted by the magneto-optical defect center material; and
   a controller configured to:
   control the optical excitation source and the RF excitation source to apply a first pulse sequence to the magneto-optical defect center material, the first pulse sequence comprising a first optical excitation pulse, a first pair of RF excitation pulses separated by a first time period, and a second optical excitation pulse to the magneto-optical defect center material;
   control the optical excitation source and the RF excitation source to apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference;
   receive a first light detection signal from the optical detector based on an optical signal emitted by the magneto-optical defect center material due to the second optical excitation pulse;
   receive a second light detection signal from the optical detector based on an optical signal emitted by the magneto-optical defect center material due to the fourth optical excitation pulse; and
   compute a combined magnetometry curve as a function of the RF excitation frequency based on a difference between a measured value of the first light detection signal and a measured value of the second light detection signal; and
   set the first phase difference and the second phase difference based on the combined magnetometry curve.

2. The system of claim 1, wherein the controller is further configured to compute a magnetic field acting on the magneto-optical defect center material based on the combined magnetometry curve.

3. The system of claim 1, wherein the RF excitation source comprises a microwave antenna.

4. The system of claim 1, wherein the controller is configured to apply the first pair of RF excitation pulses followed by the second pair of RF excitation pulses.

5. The system of claim 1, wherein the optical signal emitted by the magneto-optical defect center material due to the second and fourth optical excitation pulses are fluorescence signals.

6. The system of claim 1, wherein the difference between the first phase difference and the second phase difference is about 180°.

7. The system of claim 6, wherein the first phase difference is about 0° and the second phase difference is about 180°.

8. The system of claim 6, wherein the first phase difference is about -90° and the second phase difference is about 90°.

9. The system of claim 1, wherein the controller is further configured to set the first phase difference and the second phase difference so as to track a linear region of the combined magnetometry curve.

10. The system of claim 1, wherein the controller is further configured to set the first phase difference and the second phase difference so as to track a region of maximum slope of the combined magnetometry curve within a linear region.

11. The system of claim 9, wherein the controller is further configured to set the first phase difference and the second phase difference so as to track a region of maximum slope of the combined magnetometry curve.

12. The system of claim 1, wherein the controller comprises a plurality of subcontrollers.

13. The system of claim 1, wherein the magneto-optical defect center material is a nitrogen vacancy (NV) diamond material comprising a plurality of NV centers.

14. The system of claim 1, wherein the first time period and the second time period are the same.

15. A method for magnetic detection using a magneto-optical defect center material comprising a plurality of defect centers, the method comprising:
- applying a first pulse sequence to the magneto-optical defect center material, the first pulse sequence comprising a first optical excitation pulse, a first pair of RF excitation pulses separated by a first time period, and a second optical excitation pulse to the magneto-optical defect center material;
- applying a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference;
- receiving a first light detection signal from an optical detector based on an optical signal emitted by the magneto-optical defect center material due to the second optical excitation pulse;
- receiving a second light detection signal from the optical detector based on an optical signal emitted by the magneto-optical defect center material due to the fourth optical excitation pulse;
- computing a combined magnetometry curve as a function of the RF excitation frequency based on a difference between a measured value of the first light detection signal and a measured value of the second light detection signal; and
- setting the first phase difference and the second phase difference based on the combined magnetometry curve.

16. The method of claim 15, further comprising computing a magnetic field acting on the magneto-optical defect center material based on the combined measurement.

17. The method of claim 15, wherein the first pair of RF excitation pulses is applied followed by the second pair of RF excitation pulses.

18. The method of claim 15, wherein optical signals emitted by the magneto-optical defect center material due to the second and fourth optical excitation pulses are fluorescence signals.

19. The method of claim 15, wherein the difference between the first phase difference and the second phase difference is about 180°.

20. The method of claim 19, wherein the first phase difference is about 0° and the second phase difference is about 180°.

21. The method of claim 19, wherein the first phase difference is about -90° and the second phase difference is about 90°.

22. The method of claim 15, further comprising setting the first phase difference and the second phase difference so as to track a linear region of the combined magnetometry curve.

23. The method of claim 22, further comprising setting the first phase difference and the second phase difference so as to track a region of maximum slope of the combined magnetometry curve.

24. The method of claim 15, wherein the magneto-optical defect center material is a nitrogen vacancy (NV) diamond comprising a plurality of NV centers.

25. The method of claim 15, wherein the first time period and the second time period are the same.

26. A system for magnetic detection using a magneto-optical defect center material comprising a plurality of defect centers, the system comprising:
- means for applying a first pulse sequence to the magneto-optical defect center material, the first pulse sequence comprising a first optical excitation pulse, a first pair of RF excitation pulses separated by a first time period, and a second optical excitation pulse to the magneto-optical defect center material;
- means for applying a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference;
- means for receiving a first light detection signal from an optical detector based on an optical signal emitted by the magneto-optical defect center material due to the second optical excitation pulse;
- means for receiving a second light detection signal from the optical detector based on an optical signal emitted by the magneto-optical defect center material due to the fourth optical excitation pulse;
- means for computing a combined measurement based on a difference between a measured value of the first light detection signal and a measured value of the second light detection signal; and means for setting the first phase difference and the second phase difference based on the combined magnetometry curve.

27. A system for magnetic detection of an external magnetic field, comprising:
a magneto-optical defect center material comprising a plurality of magneto-optical defect centers;
a radio frequency (RF) excitation source configured to provide RF excitations to the magneto-optical defect center material;
an optical excitation source configured to provide optical excitation to the magneto-optical defect center material;
an optical detector configured to receive an optical signal based on light emitted by the magneto-optical defect center material; and
a controller configured to:
control the optical excitation source and the RF excitation source to apply a first pulse sequence to the magneto-optical defect center material, the first pulse sequence comprising a first optical excitation pulse, a first pair of RF excitation pulses separated by a first time period, and a second optical excitation pulse to the magneto-optical defect center material;
control the optical excitation source and the RF excitation source to apply a second pulse sequence to the magneto-optical defect center material, the second pulse sequence comprising a third optical excitation pulse, a second pair of RF excitation pulses separated by a second time period, and a fourth optical excitation pulse to the magneto-optical defect center material, wherein the excitation pulses of the first pair of RF excitation pulses have a first phase difference, the excitation pulses of the second pair of RF excitation pulses have a second phase difference, and the second phase difference is different from the first phase difference;
receive a first light detection signal from the optical detector based on an optical signal emitted by the magneto-optical defect center material due to the second optical excitation pulse;
receive a second light detection signal from the optical detector based on an optical signal emitted by the magneto-optical defect center material due to the fourth optical excitation pulse;
compute a combined magnetometry curve as a function of the RF excitation frequency based on a difference between a measured value of the first light detection signal and a measured value of the second light detection signal; and
modify the first phase difference and the second phase difference based on the combined magnetometry curve.

28. A system for magnetic detection of an external magnetic field, comprising:
a magneto-optical defect center material comprising a plurality of magneto-optical defect centers;
a radio frequency (RF) excitation source configured to provide RF excitations to the magneto-optical defect center material;
an optical excitation source configured to provide optical excitation to the magneto-optical defect center material;
an optical detector configured to receive an optical signal based on light emitted by the magneto-optical defect center material; and
a controller configured to:
control the optical excitation source and the RF excitation source to apply a first pulse sequence to the magneto-optical defect center material, the first pulse sequence comprising a first continuous wave optical excitation and a first pair of RF excitation pulses separated by a first time period, the first continuous wave optical excitation occurring continuously from before, during and after the first pair of RF excitation pulses;
control the optical excitation source and the RF excitation source to apply a second pulse sequence to the magneto-optical defect center material, the second pulse sequence comprising a second continuous wave optical excitation and a second pair of RF excitation pulses separated by a second time period, the second continuous wave optical excitation occurring continuously from before, during and after the second pair of RF excitation pulses, wherein the excitation pulses of the first pair of RF excitation pulses have a first phase difference, the excitation pulses of the second pair of RF excitation pulses have a second phase difference, and the second phase difference is different from the first phase difference;
receive a first light detection signal from the optical detector based on an optical signal emitted by the magneto-optical defect center material due to the first continuous wave optical excitation;
receive a second light detection signal from the optical detector based on an optical signal emitted by the magneto-optical defect center material due to the second continuous wave optical excitation; and
compute a combined magnetometry curve as a function of the RF excitation frequency based on a difference between a measured value of the first light detection signal and a measured value of the second light detection signal; and
set the first phase difference and the second phase difference based on the combined magnetometry curve.

29. A method for magnetic detection using a magneto-optical defect center material comprising a plurality of defect centers, the method comprising:
applying a first pulse sequence to the magneto-optical defect center material, the first pulse sequence comprising a first continuous wave optical excitation and a first pair of RF excitation pulses separated by a first time period, the first continuous wave optical excitation occurring continuously from before, during and after the first pair of RF excitation pulses;
applying a second pulse sequence to the magneto-optical defect center material, the second pulse sequence comprising a second continuous wave optical excitation and a second pair of RF excitation pulses separated by a second time period, the second continuous wave optical excitation occurring continuously from before, during and after the second pair of RF excitation pulses, wherein the excitation pulses of the first pair of RF excitation pulses have a first phase difference, the excitation pulses of the second pair of RF excitation pulses have a second phase difference, and the second phase difference is different from the first phase difference;
receiving a first light detection signal from an optical detector based on an optical signal emitted by the magneto-optical defect center material due to the first continuous wave optical excitation;

receiving a second light detection signal from the optical detector based on an optical signal emitted by the magneto-optical defect center material due to the second continuous wave optical excitation;

computing a combined magnetometry curve as a function of the RF excitation frequency based on a difference between a measured value of the first light detection signal and a measured value of the second light detection signal; and setting the first phase difference and the second phase difference based on the combined magnetometry curve.

* * * * *